United States Patent
Cheng et al.

(10) Patent No.: US 8,323,868 B2
(45) Date of Patent: Dec. 4, 2012

(54) BILAYER SYSTEMS INCLUDING A POLYDIMETHYLGLUTARIMIDE-BASED BOTTOM LAYER AND COMPOSITIONS THEREOF

(75) Inventors: Joy Cheng, San Jose, CA (US); Ho-Cheol Kim, San Jose, CA (US); Hiroshi Ito, San Jose, CA (US); Atsuko Ito, legal representative, San Jose, CA (US); Hoa D. Truong, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 12/613,800

(22) Filed: Nov. 6, 2009

(65) Prior Publication Data
US 2011/0111339 A1    May 12, 2011

(51) Int. Cl.
G03F 7/00    (2006.01)
G03F 7/004    (2006.01)
G03F 7/028    (2006.01)
G03F 7/11    (2006.01)

(52) U.S. Cl. .................. 430/270.1; 430/271.1; 430/311; 430/913; 430/927

(58) Field of Classification Search ............... 430/270.1, 430/271.1, 927, 913, 311
See application file for complete search history.

(56) References Cited

U.S. PATENT DOCUMENTS

| | | | |
|---|---|---|---|
| 4,814,258 A * | 3/1989 | Tam | 430/315 |
| 4,837,124 A | 6/1989 | Wu et al. | |
| 4,968,581 A * | 11/1990 | Wu et al. | 430/192 |
| 5,122,387 A | 6/1992 | Takenaka et al. | |
| 5,486,424 A * | 1/1996 | Nakato et al. | 428/451 |
| 5,580,694 A * | 12/1996 | Allen et al. | 430/270.1 |
| 5,679,495 A | 10/1997 | Yamachika et al. | |
| 5,879,853 A | 3/1999 | Azuma | |
| 5,985,524 A | 11/1999 | Allen et al. | |
| 6,074,800 A | 6/2000 | Breyta et al. | |
| 6,093,517 A * | 7/2000 | Ito et al. | 430/270.1 |
| 6,303,260 B1 | 10/2001 | Hurditch et al. | |
| 6,605,412 B2 | 8/2003 | Iwata et al. | |
| 6,777,161 B2 * | 8/2004 | Yasunami et al. | 430/270.1 |
| 6,824,952 B1 | 11/2004 | Minsek et al. | |
| 7,037,638 B1 * | 5/2006 | Afzali-Ardakani et al. | 430/288.1 |
| 7,364,840 B2 | 4/2008 | Tsai et al. | |

(Continued)

FOREIGN PATENT DOCUMENTS
EP    0341843 A2    4/1989
(Continued)

OTHER PUBLICATIONS

Micro-Chem "LOR and PMGI Resists", University of Minnesota, Nanofabrication Center; http://www.nfc.umn.edu/photolithography/datasheet_lor.pdf: downloaded Nov. 25, 2009, undated, 13 pgs.

(Continued)

Primary Examiner — Amanda C. Walke
(74) Attorney, Agent, or Firm — Cantor Colburn LLP

(57) ABSTRACT

Bilayer systems include a bottom layer formed of polydimethylglutarimide, an acid labile dissolution inhibitor and a photoacid generator. The bilayer system can be exposed and developed in a single exposure and development process.

19 Claims, 10 Drawing Sheets

U.S. PATENT DOCUMENTS

| | | | |
|---|---|---|---|
| 7,563,563 B2 * | 7/2009 | Chen et al. | 430/326 |
| 7,951,525 B2 * | 5/2011 | Dipietro et al. | 430/270.1 |
| 2005/0260519 A1 * | 11/2005 | Berger et al. | 430/270.1 |
| 2006/0199103 A1 * | 9/2006 | Neisser et al. | 430/270.1 |
| 2007/0202440 A1 | 8/2007 | Sooriyakumaran et al. | |
| 2007/0248911 A1 | 10/2007 | Iwasawa et al. | |
| 2008/0073754 A1 * | 3/2008 | Zampini et al. | 257/642 |
| 2009/0098490 A1 * | 4/2009 | Pham et al. | 430/327 |
| 2009/0107950 A1 | 4/2009 | Cheng et al. | |
| 2009/0107953 A1 | 4/2009 | Cheng et al. | |
| 2009/0291392 A1 * | 11/2009 | Chen et al. | 430/271.1 |
| 2010/0196825 A1 * | 8/2010 | Huang et al. | 430/286.1 |

FOREIGN PATENT DOCUMENTS

| | | |
|---|---|---|
| EP | 0341843 A3 | 4/1989 |
| EP | 0925932 A2 | 6/1999 |
| JP | 02017643 A | 1/1990 |
| WO | 2008036496 A1 | 3/2008 |

OTHER PUBLICATIONS

International Search Report for Application No. PCT/EP2010/062745; Mail Date: Oct. 13, 2010, 6 pgs.

Written Opinion for Application No. PCT/EP2010/062745; Mail Date: Oct. 13, 2010, 6 pgs.

Ito, Hiroshi, "Aqueous base developable deep UV resist systems based on novel monomeric and polymeric dissolution inhibitors", SPIE vol. 920, Advances in Resist Technologya nd Processing V. (1988), pp. 33-41.

Ito, Hiroshi, et al., "Evaluation of Onium Salt Cationic Photoinitiators as Novel Dissolution Inhibitor for Novolac Resin", J. Electrochem. Soc.: Solid-State Science and Technology, Sep. 1988, pp. 2322-2327.

Ito, Hiroshi et al., "Characterization and Lithographic Application of Calix[4]resorcinarene Derivatives", Chem. Mater. 2008, 20, published on Web Dec. 11, 2007, pp. 341-356.

* cited by examiner

BILAYER SYSTEMS INCLUDING A POLYDIMETHYLGLUTARIMIDE-BASED BOTTOM LAYER AND COMPOSITIONS THEREOF

BACKGROUND

This invention relates to bilayer systems employing polydimethyl-glutarimide compositions and methods of imaging the same.

The extension of photolithography to less than 50 nanometer (nm) features is seriously being considered by combining water immersion lithography with double exposure (DE) or double patterning (DP) processes since EUV lithography is not ready to be implemented and high index immersion lithography has not proved to be a viable alternative. However, DE and DP processes are costly and reduce wafer throughput. In addition, an antireflection coating (ARC) is used in these processes and plays a very important role in photolithography at these dimensions. The ARC is typically crosslinked so as to prevent interfacial mixing upon coating of a photoresist layer thereon, which subsequently has to be removed by plasma etching after development of the photoresist. The plasma etching process to remove the ARC after development of the photoresist adds to the overall manufacturing cost.

Accordingly, there is a need in the art for improved processes and materials for extending photolithography to less than 50 nm features that are commercially viable.

SUMMARY

The shortcomings of the prior art are overcome and additional advantages are provided through the provision of a photoimageable composition and a single development and single exposure process. The photoimageable composition comprises poly(dimethylglutarimide) (PMGI); an acid labile dissolution inhibitor; a photochemical acid generator (PAG); and a solvent. The use of the poly(dimethylglutarimide) (PMGI) photoimageable composition can readily and economically be configured to achieve line slimming as may be desired from some applications and/or provide an effective anti-reflective coating that is removable after development of the top resist.

The photoimageable composition can be used in a bilayer system. The bilayer system comprises a bottom layer comprising the PMGI, the acid labile dissolution inhibitor, and the photoacid generator; and a top layer comprising a photoresist.

A single exposure and single development process for patterning a bilayer system comprises exposing a bilayer system to a single exposure, wherein the bilayer system comprises a top layer formed of a photoresist and a bottom layer comprising PMGI, an acid labile dissolution inhibitor, and a photoacid generator; and developing the bilayer system in a single development step with an aqueous base developer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
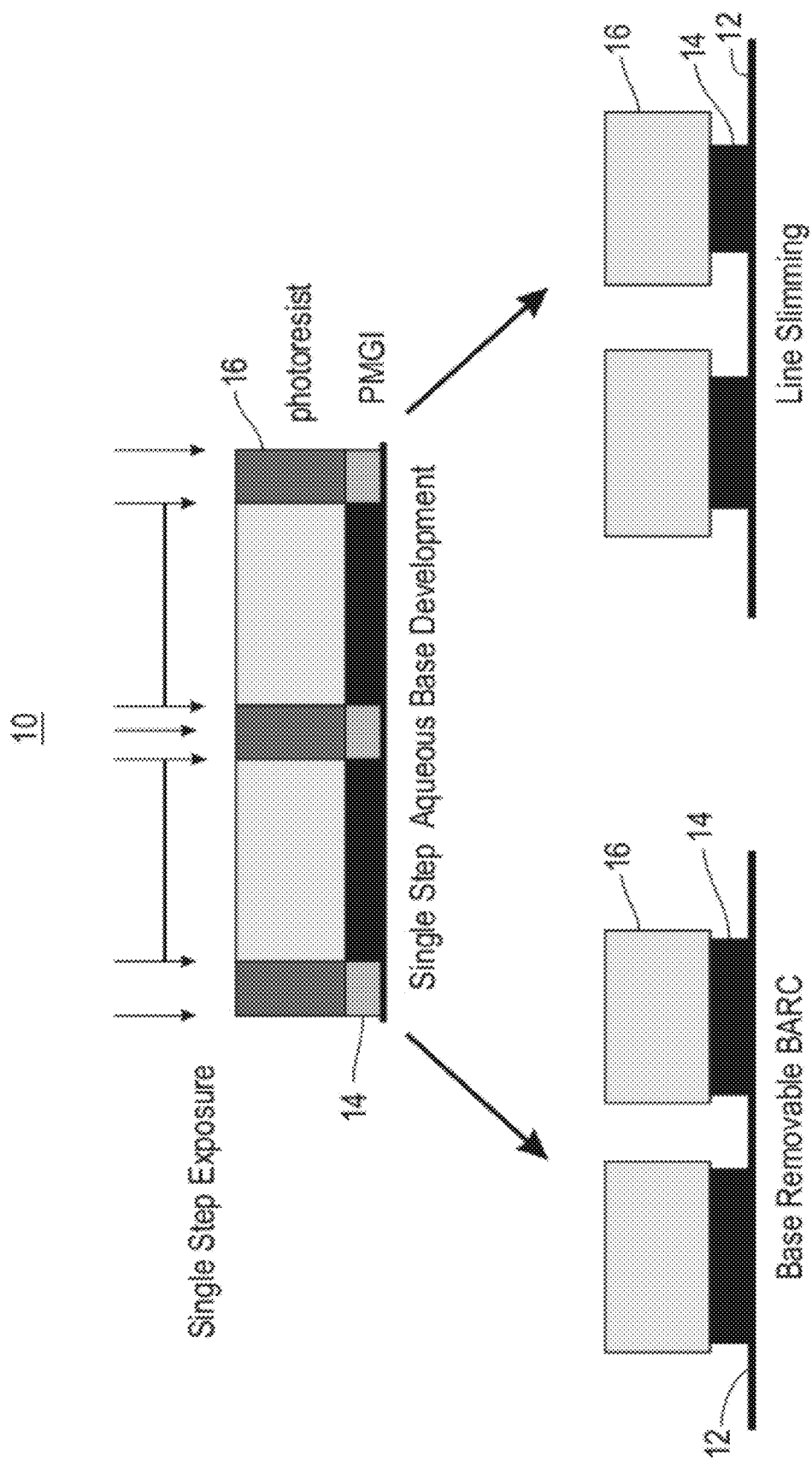
FIG. 1 schematically illustrates a single exposure-single development process for patterning a bilayer system in accordance with the present invention.

The detailed description explains the preferred embodiments of the invention, together with advantages and features, by way of example with reference to the drawings.

DETAILED DESCRIPTION

Disclosed herein are single development and single exposure photoimageable compositions for extending photolithography to less than 50 nm feature sizes. The photoimageable compositions include polydimethylglutarimide (PMGI), an acid labile dissolution inhibitor (DI), and a photochemical acid generator (PAG). The PMGI based composition can be employed as a bottom layer in a bilayer resist system for creation of an undercut by the single exposure followed by the single development. The degree of undercutting can be controlled by the composition, bake conditions, development time, and the like. The acid labile dissolution inhibitor provides the composition with greater versatility such that the composition can be configured to be more anisotropic or more isotropic, depending on the intended application, when developed. Moreover, the PMGI within the composition can function as an antireflection coating (ARC), which can be rapidly removed by base development despite the attenuated amount of radiation reaching the bottom layer, thereby eliminating the need for a plasma etch step. Still further, the bottom layer formed of the PMGI based composition does not require any crosslinking to be effective for preventing interfacial mixing upon coating of a photoresist thereon. The PMGI based composition can also serve as a guiding structure and/or a neutral surface for directing self assembly of polymers including block copolymers and polymer blends. For example, PMGI provides a neutral surface to allow perpendicular orientation of microdomains of hybrid of poly(styrene-b-ethylene oxide) and organosilicate.

As noted above, the PMGI based coating composition includes PMGI, an acid labile dissolution inhibitor, a photo-acid generator and a solvent. PMGI is of formula (I) below:

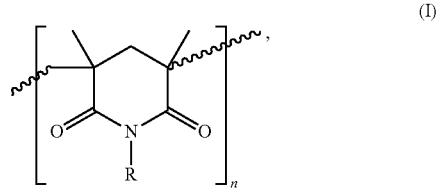

(I)

wherein R is H or $CH_3$, and n is an integer from 10 to 10,000 in some embodiments, 10 to 5,000 in other embodiments, and 10 to 2,000 in still other embodiments. The average weight molecular weight of PMGI is 500 g/mol to 1,000 g/mol in some embodiments, 1 kg/mol to 500 kg/mol in other embodiments, and 1 kg/mol to 100 kg/mol in still other embodiments. The dissolution rate of PMGI can be adjusted by changing the molecluar weight and/or bake temperatures, by exposing the coating composition to radiation, e.g., radiation at a wavelength of 254 nm, by partially protecting the acidic NH group in the PMGI formula, by changing developer strength, by incorporating additives, and the like. The amount of PMGI in the coating composition herein preferably comprises about 1 to about 40 weight percent based on the total weight of the solvent in the composition; in other embodiments, the PMGI in the coating composition herein preferably comprises about 1 to about 30 weight percent based on the total weight of the solvent in the composition; and in still other embodiments, in the coating composition herein preferably comprises about 2 to about 10 weight percent based on the total weight of the solvent in the composition.

Suitable acid labile dissolution inhibitors are known to those skilled in the art and/or described in the pertinent literature. Preferred acid labile dissolution inhibitors have high solubility in the resist composition and the solvent used to prepare solutions of the resist composition, exhibit a desired amount of dissolution inhibition, have a high exposed dissolution rate, exhibit a moderating influence on Tg, strong etch resistance, and display good thermal stability (i.e., stability at temperatures of about 140° C. or greater). Both polymeric and monomeric acid labile dissolution inhibitors may be used in the PMGI coating composition of the invention.

Suitable acid-labile dissolution inhibitors include, but are not limited to, bisphenol A derivatives and carbonate derivatives, wherein the hydroxyl group of bisphenol A (Bis-A) is replaced by an acid labile group. Suitable acid-labile protecting groups generally include, but are not limited to, moieties having the structure of formula (II)

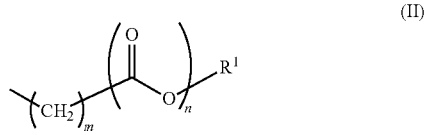

(II)

in which m is 0 to 4, n is 0 to 1, and $R^1$ is $CR^2R^3R^4$, $SiR^5R^6R^7$ or $GeR^5R^6R^7$, wherein $R^2$, $R^3$ and $R^4$ are independently hydrogen, alkyl, alkoxy, aryl, or aryloxy, typically hydrogen, lower alkyl or lower alkoxy, or are linked to form a cycloalkyl or cyclooxyalkyl ring, typically a five- to twelve-membered ring, and $R^5$, $R^6$ and $R^7$ are the same or different and are each an alkyl, typically a lower alkyl, substituent.

The R' moieties are independently selected from the group consisting of hydrogen, alkyl, aryl, and alkaryl. When an R' is alkyl, aryl or alkaryl, it may be substituted with one to four substituents selected from the group consisting of hydroxy, halogen, lower alkyl, lower alkoxy and nitro. Examples of particularly preferred R' groups include, but are not limited to, hydrogen, $C_1$-$C_{12}$ alkyl, and $C_1$-$C_{12}$ alkyl substituted with a terminal hydroxyl group, a halogen atom, particularly bromo, a phenyl ring, or a phenyl ring bearing a hydroxy, halogen or lower alkyl substituent.

Thus, $R^1$ may be, for example, methoxymethyl, ethoxymethyl, methoxyethoxymethyl, benzyloxymethyl, cyclopropylmethyl, diphenylmethyl, triphenylmethyl, 1-methoxyethyl, 1,1-dimethoxyethyl, 1-ethoxyethyl, 1-ethylthiomethyl, 1,1-diethoxyethyl, 1-phenoxyethyl, 1,1-diphenoxyethyl, 1-cyclopropylethyl, 1-phenylethyl, 1,1-diphenylethyl, t-butyl, 1,1-dimethylpropyl, 1-methylbutyl, 1,1-dimethylbutyl, methylcyclopentyl, ethylcyclopentyl, methylcyclohexyl, ethylcyclohexyl, methylcyclooctyl, ethylcyclooctyl, methyladamantyl, ethyladamantyl, trimethylsilyl, ethyldimethylsilyl, diethylmethylsilyl, triethylsilyl, dimethylisopropylsilyl, t-butyldimethylsilyl, di-t-butylmethylsilyl, tri-t-butylsilyl, dimethylphenylsilyl, methyldiphenylsilyl, triphenylsilyl, trimethylgermyl, ethyldimethylgermyl, diethylmethylgermyl, triethylgermyl, dimethylisopropylgermyl, methyldiisopropylgermyl, triisopropylgermyl, t-butyldimethylgermyl, di-t-butylmethylgermyl, tri-t-butylgermyl, dimethylphenylgermyl, methyldiphenylgermyl, triphenylgermyl, and the like. Other suitable acid-labile protecting groups may be found in the pertinent literature and texts (e.g., Greene et al., Protective Groups in Organic Synthesis, $2^{nd}$ Ed. (New York: John Wiley & Sons, 1991)).

Representative —OR moieties are illustrated in formulas (III)-(VIII) below.

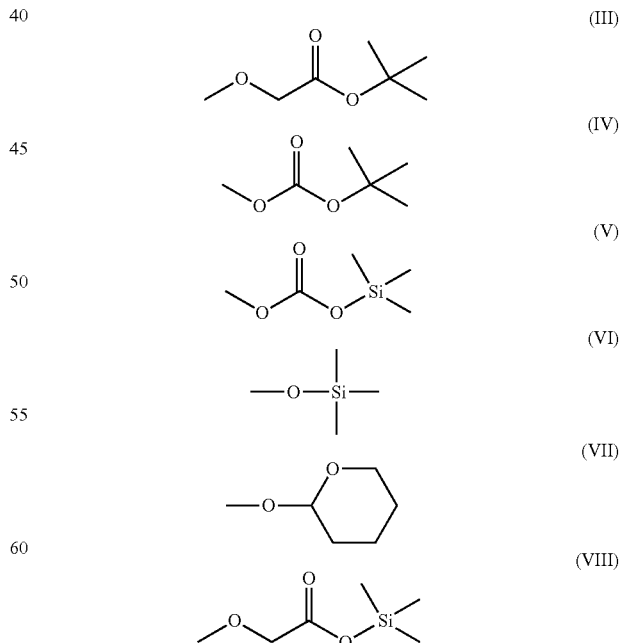

Examples of suitable acid labile dissolution inhibitor compounds include lower alkyl esters of cholic, ursocholic and lithocholic acid, including methyl cholate, methyl litho-cholate, methyl ursocholate, t-butyl cholate, t-butyl litho-cholate, t-butyl ursocholate, and the like (see, e.g., Allen et al. (1995)/ *Photopolym. Sci. Technol.*, cited supra); hydroxyl-substituted analogs of such compounds (ibid.); and androstane-17-alkylcarboxylates substituted with 1 to 3 C—C4 fluoroalkyl carbonyloxy substituents, such as t-butyl trifluoroacetyllithocholate (see, e.g., U.S. Pat. No. 5,580,694 to Allen et al.). Other suitable acid labile dissolution inhibitors include acid labile protected calixarenes and derivatives thereof.

In one embodiment, the calixarenes are calix[4]resorcinarenes having the structure of formula (IX), wherein the R moieties are the acid-labile protecting groups. It will be appreciated that the symmetric location of the —OR moieties in the calix[4]resorcinarene of formula (IX) corresponds to the positioning of the —OR moieties on the resorcinol starting material used to make these compounds. The various calix[4]resorcinarenes are condensation products of resorcinols and aldehydes.

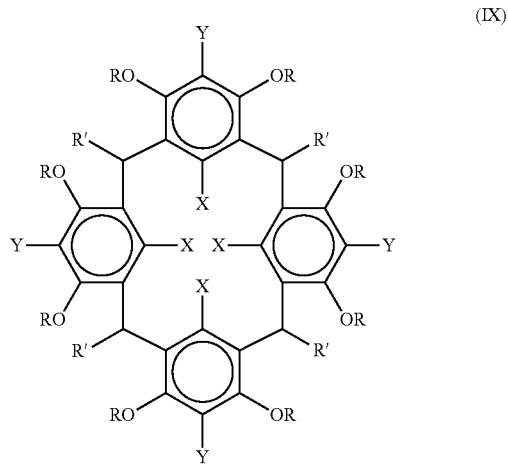

(IX)

The X and Y moieties may be the same or different and are independently selected from the group consisting of hydrogen, alkyl, alkenyl, alkynyl, alkoxy, aryl, aralkyl, alkaryl, halo, cyano, nitro and carboxylate. In certain embodiments, the X moieties are all hydrogen, and the Y moieties are selected from the group consisting of hydrogen and lower alkyl.

In addition, the basic calix[4]resorcinarene molecule can exist in either of two isomeric forms, commonly referred to as the $C_{2V}$ and the $C_{4V}$ configurations (also sometimes referred to herein as the "ctt" and "ccc" isomers, respectively).

The acid labile dissolution inhibitor will be present in the range of about 1 wt. % to about 50 wt. % by weight of the PMGI in some embodiments, and about 1 wt. % to about 40 wt. % by weight of the PMGI in other embodiments, and about 1 wt. % to about 30 wt. % by weight of the PMGI in still other embodiments.

Upon exposure to radiation, the PAG generates an acid that is used to cleave the acid labile groups of the acid labile dissolution inhibitor. A variety of PAGs can be used in the PMGI based composition of the present invention. Generally, suitable acid generators have a high thermal stability (preferably to temperatures greater than 140° C.) so they are not degraded during pre-exposure processing.

Suitable photoacid generators include, without limitation, (1) sulfonium salts, such as triphenylsulfonium perfluoromethanesulfonate (triphenylsulfonium triflate), triphenyl-sulfonium perfluoropentane-sulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenyl-sulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, triphenylsulfonium nonaflate (TPSONf), diphenylethylsulfonium chloride, and phenacyldimethylsulfonium chloride; (2) halonium salts, particularly iodonium salts, including diphenyliodonium perfluoromethanesulfonate (diphenyl)odonium triflate), diphenyliodonium perfluorobutanesulfonate, diphenyliodonium perfluoropentane-sulfonate, diphenyliodonium perfluorooctanesulfonate, diphenyliodonium hexafluoroantimonate, diphenyliodonium hexafluoroarsenate, bis-(t-butylphenyl)-iodonium triflate, di-t-butylphenyliodonium perfluorooctane sulfonate, and bis-(t-butylphenyl)-iodonium camphanylsulfonate; (3) α, α'-bis-sulfonyl-diazomethanes such as bis(p-toluenesulfonyl) diazomethane, methylsulfonyl p-toluenesulfonyldiazomethane, 1-cyclohexylsulfonyl-1-(1,1-dimethylethylsulfonyl)diazomethane, and bis(cyclohexylsulfonyl)diazomethane; (4) trifluoromethanesulfonate esters of imides and hydroxyimides, e.g., α-(trifluoromethylsulfonyloxy)-bicyclo[2.2.1]hept-5-ene-2,3-dicarboximide (MDT); (5) nitrobenzyl sulfonate esters such as 2-nitrobenzyl p-toluenesulfonate, 2,6dinitrobenzyl p-toluenesulfonate, and 2,4-dinitrobenzyl p-trifluoromethylbenzene sulfonate; (6) sulfonyloxynaphthalimides such as N-camphorsulfonyloxynaphthalimide and N-pentafluorophenylsulfonyloxynaphthalimide; (7) pyrogallol derivatives (e.g., trimesylate of pyrogallol); (8) naphthoquinone-4-diazides; (9) alkyl disulfones; (10) s-triazine derivatives; and (11) miscellaneous sulfonic acid generators including t-butylphenyl-α-(ptoluenesulfonyloxy)-acetate, t-butyl-α-(p-to luenesulfonyloxy) acetate, and N-hydroxynaphthalimide dodecane sulfonate (DDSN), and benzoin tosylate.

Other suitable PAGs are disclosed in Reichmanis et al. (1991), *Chemistry of Materials* 3:395, and in U.S. Pat. No. 5,679,495 to Yamachika et al. Additional suitable acid generators useful in conjunction with the compositions and methods provided herein will be known to those skilled in the art and/or are described in the pertinent literature.

The PAG will be present in the range of about 0.001 wt. % to about 20 wt. % by weight of the PMGI in some embodiments, and about 0.01 wt. % to about 15 wt. % by weight of the PMGI in other embodiments, and about 0.01 wt. % to about 10 wt. % by weight of the PMGI in other embodiments.

Other customary additives may also be present in the PMGI coating composition, including pigments, sensitizers, preservatives, acid-diffusion controlling agents, coating aids such as surfactants or anti-foaming agents, adhesion promoters, plasticizers, and surface modifying agents, among others. Typically, the sum of all customary additives will comprise less than 20 percent of the solids included in the composition, and preferably, less than 5 percent of the solids in the composition.

The PMGI coating composition further includes a solvent. The choice of solvent is governed by many factors not limited to the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. See, e.g., Introduction to Microlithography, Eds. Thompson et al., cited previously. Solvents may generally be chosen from ether-, ester-, hydroxyl-, and ketone-containing compounds, or mixtures of these compounds. Examples of appropriate solvents include cyclopentanone, cyclohexanone, lactate esters such as ethyl lactate, alkylene glycol alkyl ether esters such as propylene glycol methyl ether acetate, alkylene glycol monoalkyl esters such as methyl cellosolve, butyl acetate, 2-ethoxyethanol, and ethyl 3-ethoxypropionate. Preferred solvents include ethyl lactate, propylene glycol methyl ether acetate, and mixtures of ethyl lactate and ethyl 3-ethoxyproprionate. The above list of solvents is for illustrative purposes only and should not be viewed as being comprehensive nor should the choice of solvent be viewed as limiting the invention in any way. Those skilled in the art will recognize that any number of solvents or solvent mixtures may be used.

The above list of solvents is for illustrative purposes only and should not be viewed as being comprehensive nor should the choice of solvent be viewed as limiting the invention in any way. Those skilled in the art will recognize that any number of solvents or solvent mixtures may be used. Greater than 50 percent of the total mass of the resist formulation is typically composed of the solvent, preferably greater than 80 percent.

The bilayers system process 10 generally includes a single exposure and single development as is set forth in FIG. 1. A layer 14 of a PMGI composition in accordance with the present invention is cast onto a substrate 12. Casting may be affected by any means including, but not limited to, spin coating, immersion, dip coating, doctor blading, and the like. A photoresist top layer 16 is then cast on the PMGI layer 14. Advantageously, interfacial mixing of the photoresist layer with the PMGI layer is minimal, if any, without crosslinking of the PMGI layer. A single exposure is employed to lithographically pattern the photoresist followed by development in an aqueous base developer. Unexpectedly, dissolution of the PMGI based composition is rapid despite the attenuated amount of radiation.

As presented schematically in FIG. 1, the PMGI-based composition can be employed as a bottom layer in a bilayer system and can be optimized to function: 1) as a bottom antireflection coating (BARC) with minimal undercut; or 2) in line slimming application for lift off processes, all in a single step exposure/single step development process. Another attractive feature of PMGI is that it provides a guiding structure and/or neutral surface for directing self assembly of polymers including block copolymers and polymer blends. For example, PMGI provides a neutral surface to self-assembly of a block copolymer hybrid material (e.g., poly(styrene-b-ethylene oxide) and organo silicate).

For BARC (i.e., bottom antireflective coatings) applications, the absorption of the PMGI layer can be adjusted by selecting a PAG, by selection of DI (aromatic DI for higher absorption, aliphatic DI such as BAD for lower absorption, or a mixture of the two) or by adding a dye such as Sudan Orange which does not affect the dissolution rate of PMGI. Scanning electron micrographs (SEM) in FIG. 6 demonstrate that fine line/space patterns (130 nm) can be in fact produced in the bilayer resist with a minimal undercut in the bottom PMGI layer by one step 193 nm exposure followed by one step development. In this case the etch removal of conventional BARC is completely eliminated.

It is to be understood that while the invention has been described in conjunction with the preferred specific embodiments thereof, that the foregoing description as well as the examples that follow are intended to illustrate and not limit the scope of the invention. Other aspects, advantages and modifications within the scope of the invention will be apparent to those skilled in the art to which the invention pertains.

EXAMPLE 1

Figure 2:
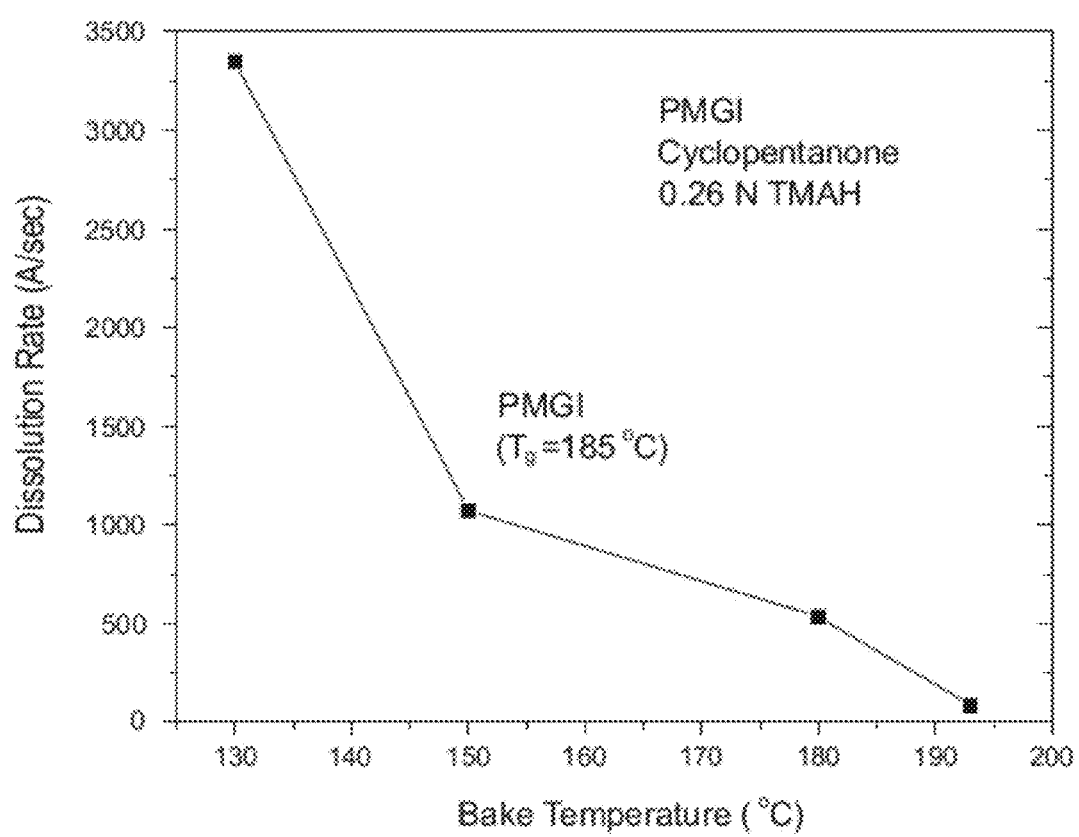
FIG. 2 graphically illustrates dissolution rate in 0.26 N tetramethylammonium hydroxide (TMAH) as a function of bake temperature for PMGI films.

In this example, the dissolution rate as a function of bake temperature of a PMGI film in 0.26 N tetramethylammonium hydroxide (TMAH) developer was measured using a quartz crystal microbalance. The film was cast from a solution of PMGI and cyclopentanone. The PMGI ($R=CH_3$) was synthesized in house, exhibited a glass transition temperature of 185° C., and had a number average weight molecular weight of 13.4 kg/mol. FIG. 2 graphically illustrates the dissolution rate (angstroms/second) as a function of the bake temperature. As shown, PMGI, by itself, exhibited a dissolution rate in 0.26 N TMAH of about 3400 angstroms per second (A/sec) at a post apply bake of 130° C./60 seconds and exhibited a dissolution rate of about 1071 A/sec when the post apply bake temperature was increased to 150° C./60 seconds.

EXAMPLE 2

Figure 3:
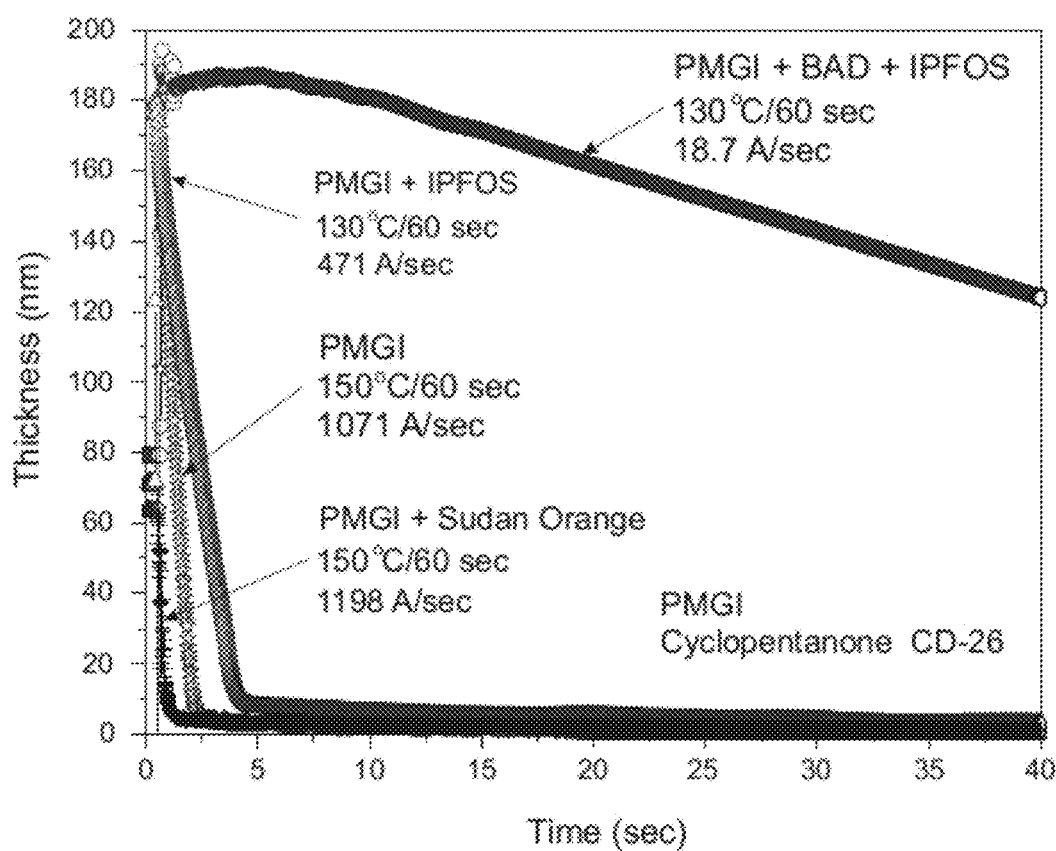
FIG. 3 graphically illustrates dissolution rate kinetics in 0.26 N TMAH for various PMGI compositions.

In this example, the dissolution rates of various PMGI containing films in 0.26 N TMAH developer were measured using a quartz crystal microbalance. The PMGI films were cast from cyclopentantone and included the following cast films: a.) PMGI baked at 150° C. for 60 seconds; b.) PMGI and bis p-t-butylphenyliodonium perfluorooctane sulfonate PAG (IPFOS) at a ratio 100:5 baked at 130° C. for 60 seconds; c.) PMGI, BAD (2,5-dimethylhex-2,5-yl-bis-adamantane-1-carboxylate) and IPFOS at a ratio of 100:20:1 baked at 130° C. for 60 seconds; and d.) PMGI and Sudan Orange at a ratio of 100:5 baked at 150° C. for 60 seconds. FIG. 3 graphically illustrates the results and shows the significant effect of the acid labile dissolution inhibitor (BAD) on dissolution rate relative to the other PGMI films that did not contain a dissolution inhibitor. In addition, when contrasting the dissolution rate of the PMGI cast film with the PMGI and IPFOS film, the dissolution rate was shown to have decreased upon the addition of the photoacid generator. The dissolution rate decreased to 471 A/sec even though the post-apply bake was 130° C. Upon addition of the acid labile dissolution inhibitor (BAD), the dissolution rate further decreased to about 19 A/sec when post apply baked at a temperature of 130° C./60 seconds. With regard to the PMGI composition that included Sudan Orange, the dissolution rate of PMGI was substantially unaffected. Thus, addition of a dye can be used to control absorbance as may be desired for some applications.

EXAMPLE 3

In this example, the dissolution kinetics of exposed and unexposed PMGI films were measured. Single layers of PMGI films (PMGI, IPFOS, BAD at a 100:20:1 ratio baked at 130° C. for 60 seconds) were cast and exposed to ultraviolet radiation at 254 nm for 60 seconds or 100 seconds. In addition, a bilayer system was formed that included a top layer of a silicon containing photoresist optimized for 193 nm exposure (SCR858 from Shin-Etsu Chemical Company, Japan) that had been deposited at a thickness of 85 nm and a bottom layer of the PMGI film (PMGI, IPFOS, BAD at a 100:20:1 ratio baked at 130° C. for 60 seconds). The optical density of the single layer of PMGI film at 193 nm was 3.0/μm.

Figure 4:
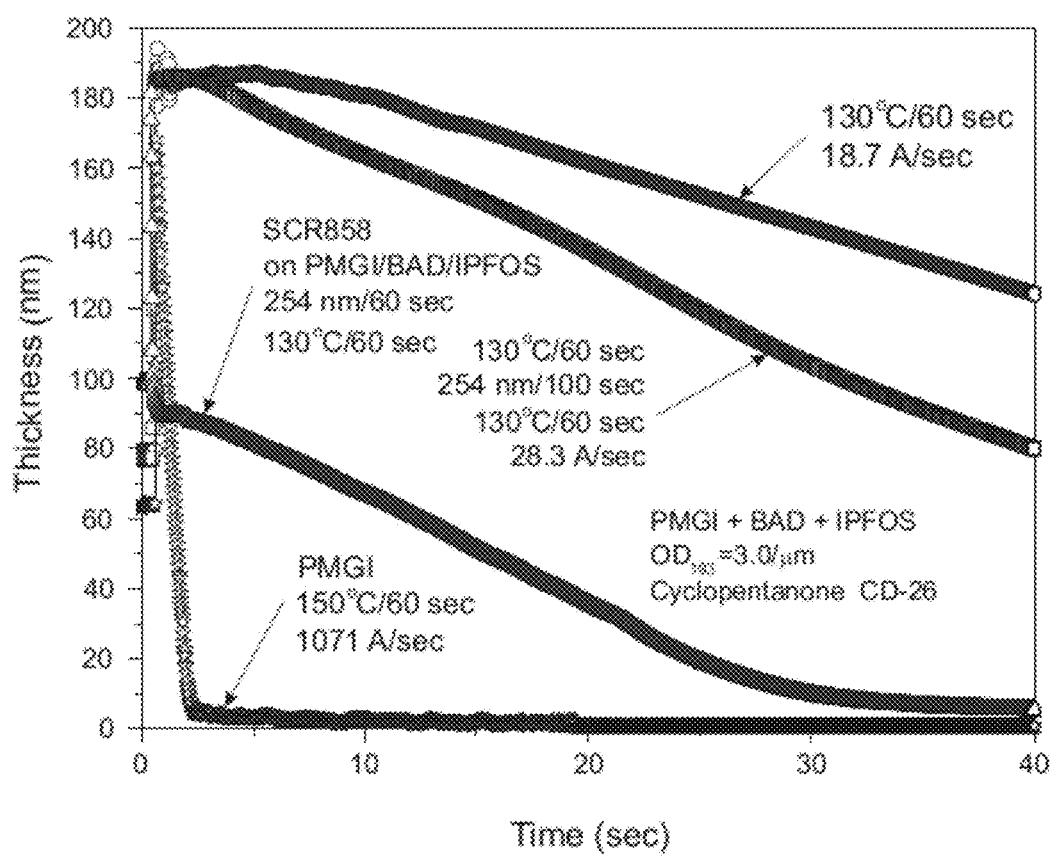
FIG. 4 graphically illustrates dissolution rate kinetics in 0.26 N TMAH for various bilayer systems employing a PMGI based bottom layer before and after exposure to UV radiation.

As shown in FIG. 4, a significant increase in dissolution rate was observed upon exposure of the single layer PGMI film to UV radiation (28 Å/sec versus 19 Å/sec). In addition, the PMGI film exposed through a 193 nm silicon containing resist dissolved at about the same rate as the exposed single layer of the PGMI film (both were about 28 Å/sec) even though the bilayer system was exposed at a lower dose (60 seconds versus 100 seconds) after very fast dissolution of the top silicon containing resist layer.

EXAMPLE 4

In this example, contrast curves of the bilayer systems exposed at 193 nm and at different bake conditions were generated with a thermal gradient hotplate (TGP). The top layer was a 193 nm photoresist obtained from Japan Synthetic Rubber Company, Japan, under the tradename 1682J-15 as a top imaging resist. The bottom layer was formed of a PMGI coating composition. In one bilayer system, the PMGI composition included a.) PMGI, BAD and IPFOS at a weight ratio of 100:20:1; and in a second bilayer system, the PGMI Composition included b.) PMGI, BAD, and TPSONf (triphenylsulphonium nonaflate) at a weight ratio of 100:20:1. The PMGI compositions in the respective bilayer systems were baked at 80° C., 92° C., 115° C., 145° C. and 165° C. for 90 secs. The post apply bake was 110° C./90 seconds and the post exposure bake was 110° C./60 seconds. Samples were developed in a 0.26N TMAH solution.

Figure 5:
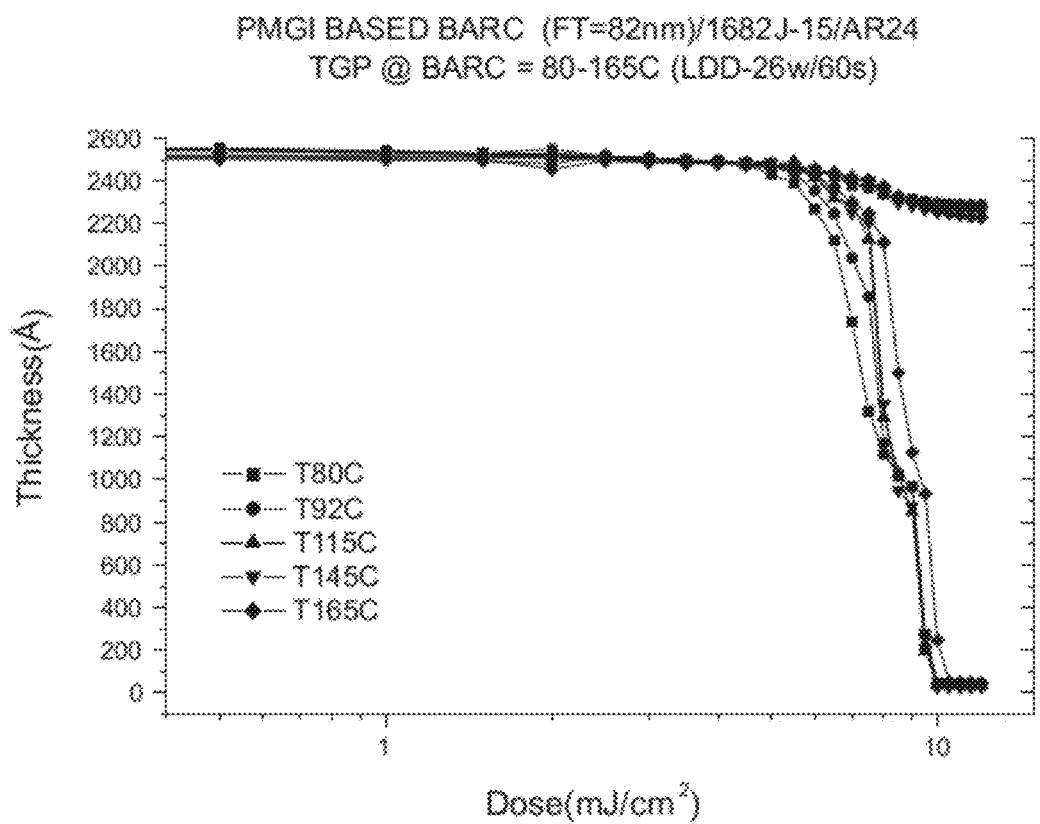
FIGS. 5 and 6 graphically illustrate contrast curves in 0.26 N TMAH for bilayer systems employing a PMGI based bottom layer with different baking conditions.
Figure 6:
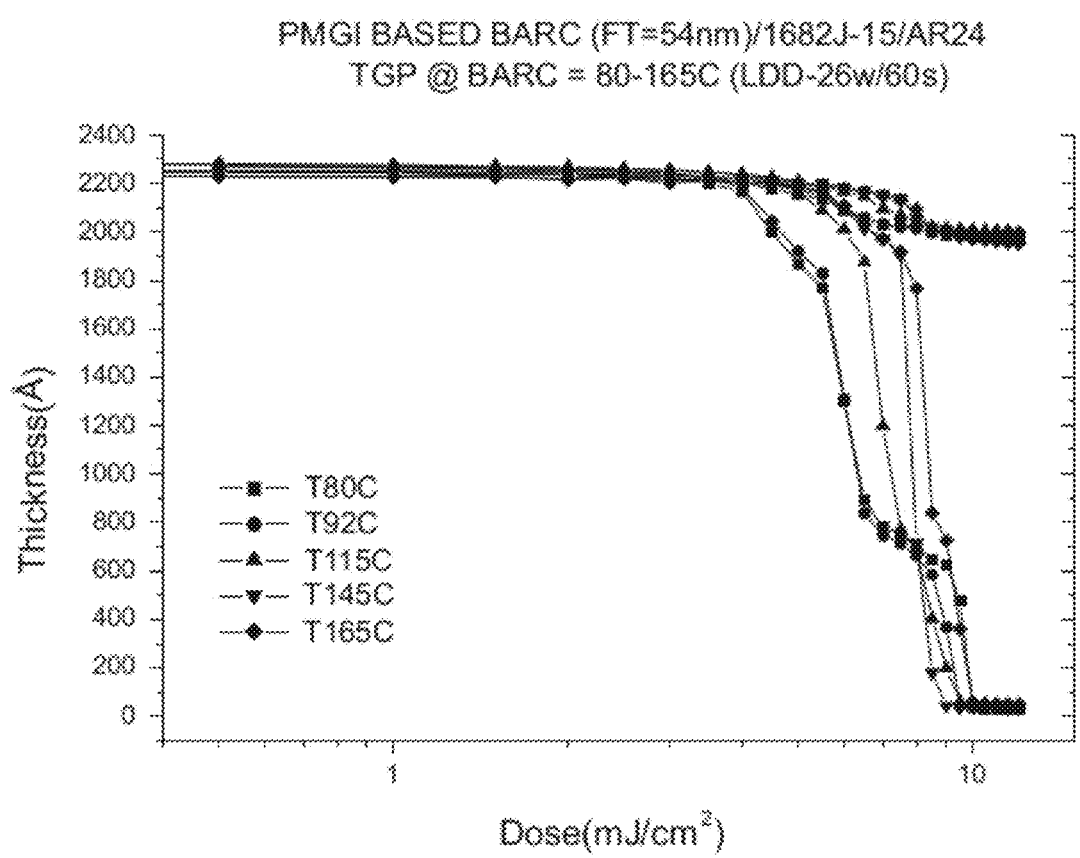

As shown in FIGS. 5 and 6, the PMGI bilayer systems developed rapidly after the top resist was fully developed in spite of the attenuated amount of 193 nm radiation reaching the PGMI based bottom layer.

EXAMPLE 5

Figure 7:
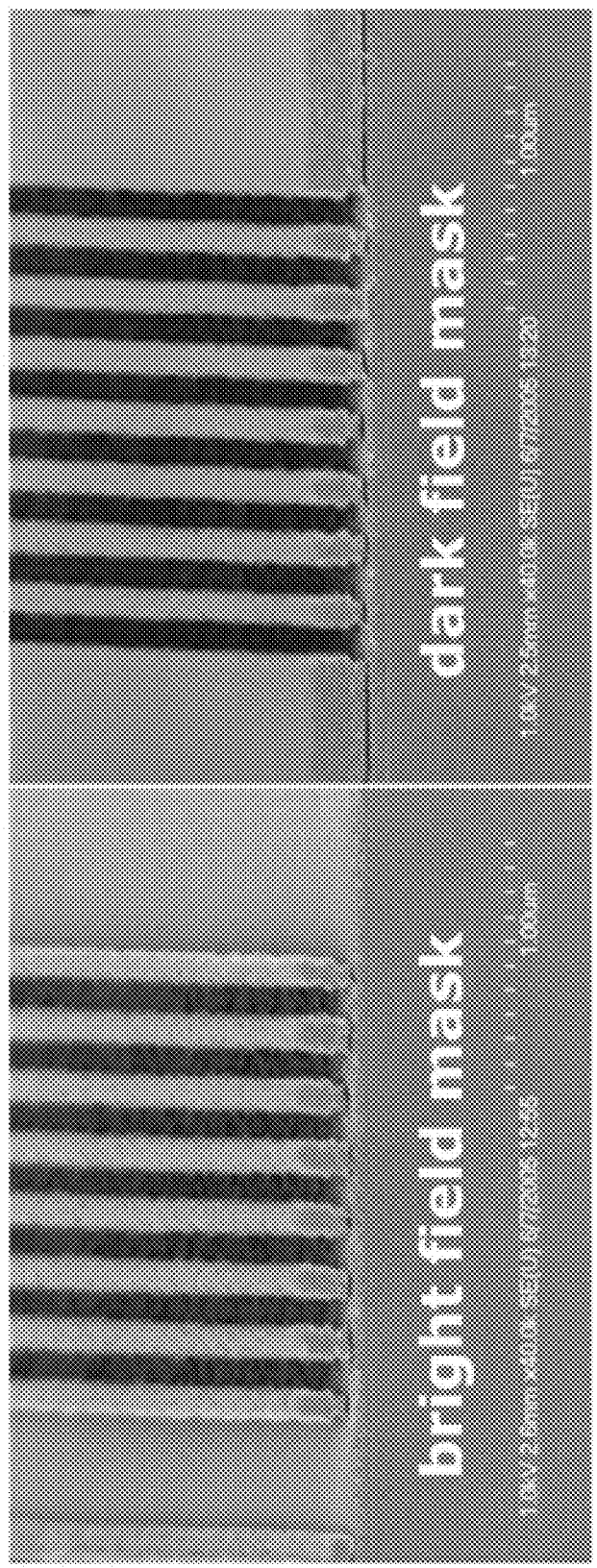
FIG. 7 pictorially illustrates scanning electron micrographs of a patterned bilayers system employing a PMGI based bottom layer imaged through a bright field mask and a dark field mask.

In this example, a bilayer system was coated onto a substrate and exposed to a single 193 nm exposure and single development process in 0.26 N TMAH. The bilayer system included a top layer formed of a 193 nm resist obtained from JSR under the tradename 1682J-15 at a thickness of 168 nm and a bottom layer formed of PGMI, BAD, and IPFOS at a weight ratio=100:20:1 at a thickness of 82 nm. The bottom layer was baked at 130° C. for 60 seconds. The top layer was post apply baked at 110° C./90 seconds, and post exposure baked at 110° C./90 seconds. The bilayer was exposed at 193 nm with a dose of 28 mJ/cm² followed by one step development in 0.26N TMAH/60 seconds. FIG. 7 provides scanning electron micrographs from bright field and dark field imaging of 130 nm line/space patterns. Straight walls were observed demonstrating the anti-reflection capability of the PMGI bottom layer with a minimal undercut. Etch removal of the conventional BARC was eliminated by use of the PGMI bottom layer.

EXAMPLE 6

In this example, bilayer systems employing three different PGMI compositions as a bottom layer were configured for linewidth slimming. The PMGI coating compositions included a.) PMGI, BAD and IPFOS at a weight ratio of 100:20:1 at a thickness of 82 nm and a post apply bake of 130° C./60 seconds. The top photoresist layer was obtained from JSR under the trade name 1682J-15 and was coated at a thickness of 168 nm with a post apply bake of 110° C./60 seconds and a post exposure bake of 110° C./60 seconds; b.) PMGI, BAD and TPSONf at a ratio of 100:20:1 at a thickness of 82 nm and a post apply bake of 130° C./60 seconds. The top photoresist layer was obtained from JSR under the trade name 1682J-15 and was coated at a thickness of 168 nm with a post apply bake of 110° C./60 seconds and a post exposure bake of 110° C./60 seconds; and c.) PMGI, di-tert-butyl (2,2'-(4,4'- (perfluoropropane-2,2-diyl)bis(4,1-phenylene)) bis(oxy)diacetate and IPFOS at a ratio of 100:20:1 at a thickness of 51 nm and a post apply bake of 180° C./60 seconds. The top photoresist layer was obtained from JSR under the trade name 1682J-15 and was coated at a thickness of 140 nm and a post apply bake of 130° C./90 seconds and post exposure bake of 130 C./90 seconds.

The optical density at 193 nm for each PMGI bottom layer in the different bilayer systems was 3.0/μm; 3.0/μm, and 6.3/μm, respectively.

Figure 8:
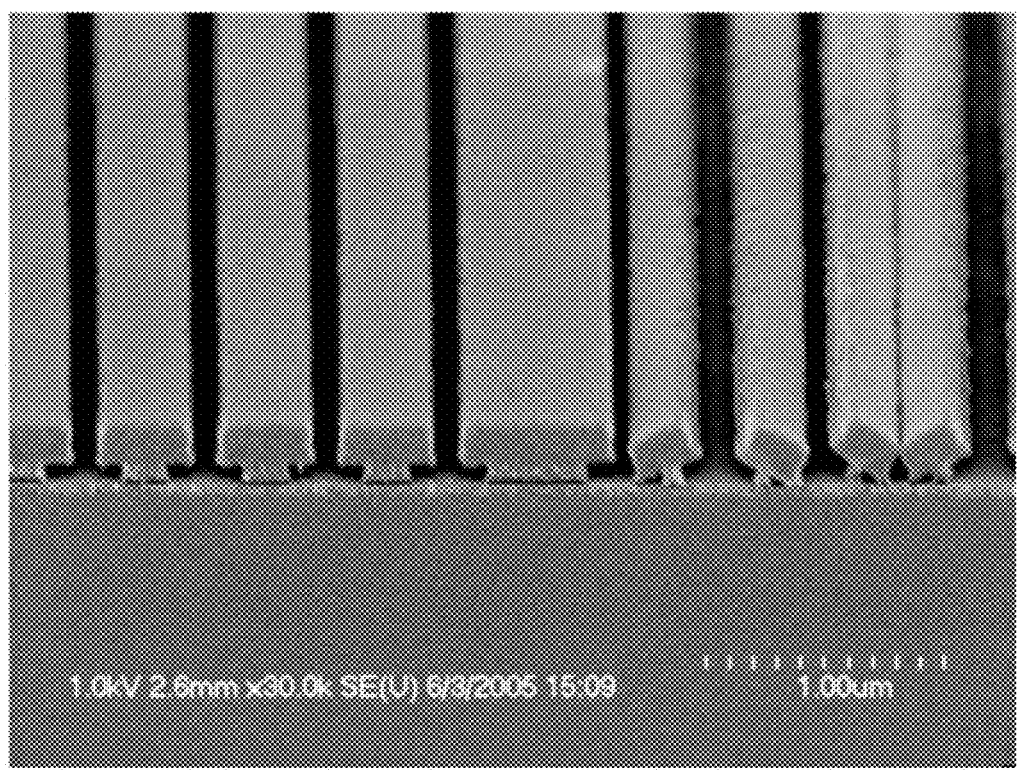
FIG. 8 pictorially illustrates scanning electron micrographs of a patterned bilayers system employing a PMGI based bottom layer formed of PMGI, 2,5-dimethylhex-2,5-yl-bis-adamantane-1-carboxylate (BAD), and p-t-butylphenyliodonium perfluorooctane sulfonate (IPFOS).
Figure 9:
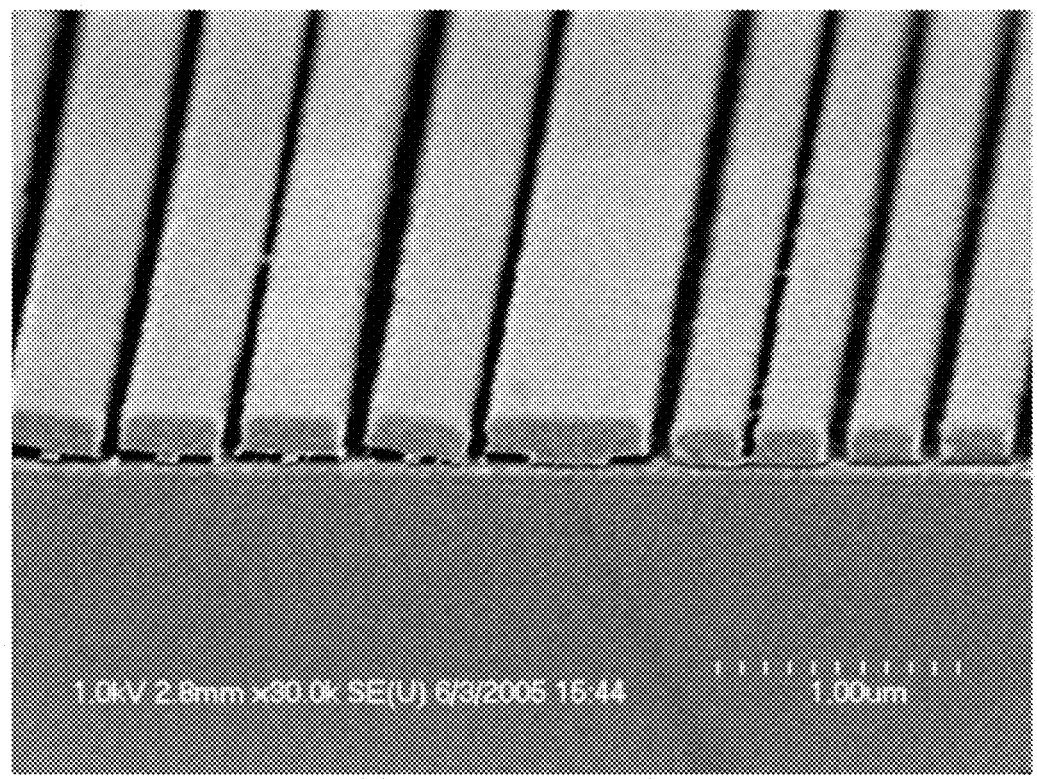
FIG. 9 pictorially illustrates scanning electron micrographs of a patterned bilayers system employing a PMGI based bottom layer formed of PMGI, BAD, and triphenylsulfonium nonaflate (TPSONO.
Figure 10:
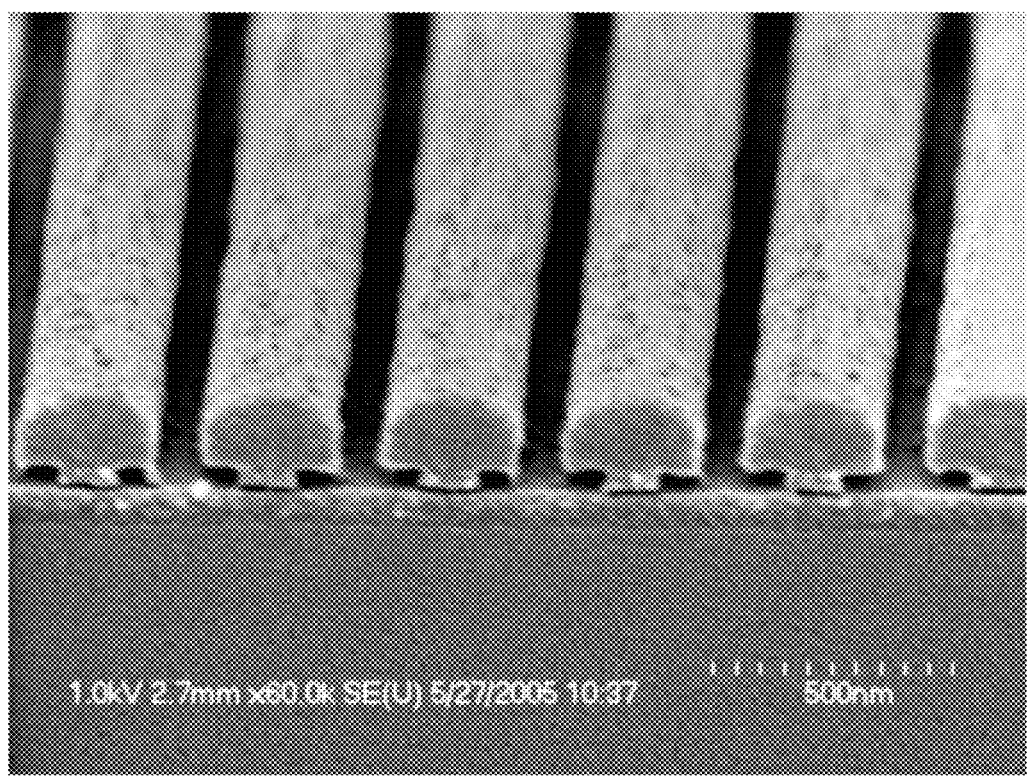
FIG. 10 pictorially illustrates scanning electron micrographs of patterned bilayers system employing a bottom layer formed of PMGI, an acid dissolution inhibitor, and a PAG in accordance with the present invention.

The bilayers systems were exposed to a single exposure of 193 nm and developed in a single development step that included puddle development in 0.26 N TMAH. The features size ranges from 200 nm to 250 nm. FIGS. 8-10 pictorially illustrate scanning electron micrographs of the exposed and developed bilayers systems. Significant undercutting was observed in each instance.

The foregoing description of the embodiments of this invention has been presented for purposes of illustration and description. It is not intended to be exhaustive or to limit the invention to the precise form disclosed, and many modifications and variations are possible. Such modifications and variations that may be apparent to a person skilled in the art are intended to be included within the scope of this invention as defined by the accompanying claims.

What is claimed is:

1. A photoimageable composition, comprising:
a poly(dimethylglutarimide) (PMGI) homopolymer of the formula:

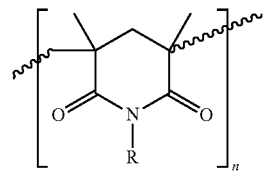

wherein R is H or CH$_3$, and n is an integer from 10-10000;
an acid labile dissolution inhibitor;
a photochemical acid generator (PAG); and
a solvent.

2. The photoimageable composition of claim 1, wherein the PMGI is 1 to 40 weight percent based on the amount by weight of the solvent; the acid labile dissolution inhibitor is 1 to 50 weight percent based on the amount by weight of PMGI in the composition, and the PAG is 0.1 to 20 weight percent based on the amount by weight of PMGI in the composition.

3. The photoimageable composition of claim 1, wherein the acid labile dissolution inhibitor is converted to an acidic form upon reaction with an acid photochemically generated from the PAG.

4. The photoimageable composition of claim 1, wherein the acid labile dissolution inhibitor is an aromatic.

5. The photoimageable composition of claim 1, wherein the acid labile dissolution inhibitor is an alicyclic.

6. The photoimageable composition of claim 1, wherein the acid labile dissolution inhibitor is a calixarene or a calixarene derivative.

7. The photoimageable composition in claim 1, further comprising an additive selected from the group consisting of a dye, a base quencher, a surfactant, a leveling agent, an acid-inert dissolution inhibitor, and combinations thereof.

8. The photoimageable composition of claim 1, wherein the PMGI has an average weight molecular weight of 1 kg/mole to 1000 kg/mol.

9. The photoimageable composition of claim 1, wherein the acid labile dissolution inhibitor is selected from the group consisting of a cholic acid, ursocholic acid lithocholic acid, and androstane-17-alkylcarboxylates.

10. A bilayer system, comprising:
    a bottom layer comprising a poly(dimethylglutarimide) (PMGI) homopolymer of the formula:

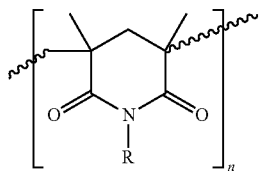

wherein R is H or CH$_3$, and n is an integer from 10-10000, an acid labile dissolution inhibitor, and a photoacid generator; and
    a top layer comprising a photoresist.

11. The bilayer system of claim 10, wherein the acid labile dissolution inhibitor is 1 to 50 weight percent based on the amount by weight of PMGI in the composition, and the PAG is 0.1 to 20 weight percent based on the amount by weight of PMGI in the composition.

12. The bilayer system of claim 10, wherein the acid labile dissolution inhibitor is an aromatic.

13. The bilayer system of claim 10, wherein the acid labile dissolution inhibitor is an alicyclic.

14. The bilayer system of claim 10, wherein the acid labile dissolution inhibitor is a calixarene or calixerene derivative.

15. The bilayer system of claim 10, wherein the acid labile dissolution inhibitor is converted to an acidic form upon reaction with an acid photochemically generated from the photochemical acid generator.

16. A process for patterning a bilayer system, comprising:
    exposing a bilayer system to a exposure, wherein the bilayer system comprises a top layer formed of a photoresist and a bottom layer comprising an unmodified poly(dimethylglutarimide) (PMGI) homopolymer of the formula:

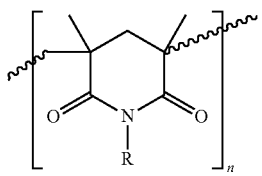

wherein R is H or CH$_3$, and n is an integer from 10-10000, an acid labile dissolution inhibitor, and a photoacid generator; and
    developing the bilayer system in a development step with an aqueous base developer.

17. The process of claim 16, wherein the bottom layer is configured such that developing the bilayer system forms an undercut in the bottom layer relative to the top layer.

18. The process of claim 16, wherein the bottom layer is configured such that developing the bilayer system removes exposed portions of the top layer and corresponding portions of the bottom layer underlying the exposed portions in the top layer.

19. The process of claim 18, wherein exposing the bilayer system is a single exposure and wherein developing the bilayer system is a single development step.

\* \* \* \* \*